United States Patent
Strock et al.

(10) Patent No.: US 10,414,694 B2
(45) Date of Patent: Sep. 17, 2019

(54) TOUGHENED BOND LAYER AND METHOD OF PRODUCTION

(71) Applicant: United Technologies Corporation, Farmington, CT (US)

(72) Inventors: Christopher W. Strock, Kennebunk, ME (US); Thomas J. Martin, East Hampton, CT (US); Alexander Staroselsky, Avon, CT (US); Sergey Mironets, Szymanow (PL)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 15/946,550

(22) Filed: Apr. 5, 2018

(65) Prior Publication Data

US 2018/0222805 A1 Aug. 9, 2018

Related U.S. Application Data

(62) Division of application No. 14/623,803, filed on Feb. 17, 2015, now abandoned.

(51) Int. Cl.
*C04B 35/622* (2006.01)
*C23C 14/22* (2006.01)
(Continued)

(52) U.S. Cl.
CPC ........ *C04B 35/62222* (2013.01); *C23C 4/073* (2016.01); *C23C 4/11* (2016.01);
(Continued)

(58) Field of Classification Search
CPC . C04B 35/62222; C23C 14/22; C23C 24/085; C23C 28/3215; C23C 28/324;
(Continued)

(56) References Cited

U.S. PATENT DOCUMENTS 4,595,637 A 6/1986 Eaton et al.
5,580,835 A * 12/1996 Wright .............. C04B 35/62231
427/320

(Continued)

FOREIGN PATENT DOCUMENTS

EP 0514640 A1 11/1992
EP 0567252 A1 10/1993
(Continued)

OTHER PUBLICATIONS

J. Corrochano, et al., Whiskers of Al2O3 as reinforcement of a powder metallurgical 6061 aluminum matrix composite, ScienceDirect, Materials Letters 62 (2008), 3 pages.

(Continued)

*Primary Examiner* — Lan Vinh
(74) *Attorney, Agent, or Firm* — Kinney & Lange, P.A.

(57) ABSTRACT

According to one embodiment of this disclosure, a coating includes a plurality of elongated reinforcing materials. The coating includes a bond coat in which a first portion of a first elongated reinforcing material is embedded. The coating further includes a ceramic coat adjacent the bond coat in which a second portion of the first elongated reinforcing material is embedded.

20 Claims, 5 Drawing Sheets

(51) Int. Cl.
*C23C 4/18* (2006.01)
*C25D 13/02* (2006.01)
*C23C 24/08* (2006.01)
*C23C 28/00* (2006.01)
*F01D 5/28* (2006.01)
*C23C 4/11* (2016.01)
*C23C 4/073* (2016.01)
*C25D 13/22* (2006.01)
*C23F 1/04* (2006.01)
*C23F 4/00* (2006.01)

(52) U.S. Cl.
CPC ............... *C23C 4/18* (2013.01); *C23C 14/22* (2013.01); *C23C 24/085* (2013.01); *C23C 28/324* (2013.01); *C23C 28/3215* (2013.01); *C23C 28/345* (2013.01); *C23C 28/3455* (2013.01); *C25D 13/02* (2013.01); *C25D 13/22* (2013.01); *F01D 5/288* (2013.01); *C23F 1/04* (2013.01); *C23F 4/00* (2013.01); *F05D 2230/31* (2013.01); *F05D 2230/90* (2013.01); *F05D 2300/1723* (2013.01); *F05D 2300/20* (2013.01); *F05D 2300/614* (2013.01)

(58) Field of Classification Search
CPC ... C23C 28/345; C23C 28/3455; C23C 4/073; C23C 4/11; C23C 4/18; C23F 1/04; C23F 4/00; C25D 13/02; C25D 13/22; F01D 5/288; F05D 2230/31; F05D 2230/90; F05D 2300/1723; F05D 2300/20; F05D 2300/614
USPC .... 438/706, 714, 758, 763, 781; 216/67, 95, 216/97
See application file for complete search history.

(56) References Cited

U.S. PATENT DOCUMENTS

| | | | |
|---|---|---|---|
| 6,551,061 | B2 | 4/2003 | Darolia et al. |
| 7,442,444 | B2 | 10/2008 | Hazel et al. |
| 8,272,843 | B1 | 9/2012 | Ryznic et al. |
| 2004/0131865 | A1 | 7/2004 | Kim et al. |
| 2007/0292654 | A1* | 12/2007 | Bohner ............... B64G 1/14 428/76 |
| 2009/0019685 | A1* | 1/2009 | Keith ............... B32B 7/08 29/469 |
| 2010/0129673 | A1 | 5/2010 | Lee |
| 2013/0126917 | A1* | 5/2013 | Kitai ............... H01L 33/20 257/88 |
| 2013/0260130 | A1* | 10/2013 | Taxacher ............... C23C 28/321 428/292.1 |

FOREIGN PATENT DOCUMENTS

| | | |
|---|---|---|
| EP | 1645652 A1 | 4/2006 |
| EP | 2615250 A1 | 7/2013 |
| EP | 1479660 A2 | 11/2014 |
| WO | WO2006040221 A1 | 4/2006 |

OTHER PUBLICATIONS

Extended European Search Report for EP Application No. 16156050.3, dated Jun. 14, 2016, 10 pages.

European Examination Report, for European Patent Application No. 16156050.3, dated Mar. 22, 2017, 6 pages.

\* cited by examiner

TOUGHENED BOND LAYER AND METHOD OF PRODUCTION

CROSS-REFERENCE TO RELATED APPLICATION(S)

This application is a divisional of U.S. application Ser. No. 14/623,803 filed Feb. 17, 2015 for "Toughened Bond Layer and Method of Production" by C. Strock, T. Martin, A. Staroselsky, and S. Mironets. The aforementioned U.S. application Ser. No. 14/623,803 is hereby incorporated by reference in its entirety.

BACKGROUND

Components that are exposed to extreme temperatures such as those in a combustion gas path in a gas turbine engine are typically provided with a protective ceramic coating. The coating can include a multiple layers that are built up on the part.

As the components and the protective coating are exposed to thermal cycles (e.g., during operation of the gas turbine engine) the layers forming the coating experience significant amounts of thermal and mechanical stress. The layers may each have a different modulus of elasticity or undergo different rates of thermal expansion. This can cause the connections between each layer to fail or cause cracks to form in the coating. These cracks can propagate through the coating and cause spallation of the coating from the part. Additionally, an oxide layer can grow between the layers of the coating. Growth of the oxide layer can also affect the connection of the layers and cause further spallation of the coating from the part.

There is, therefore, a need for a coating that improves the connection between the layers forming the coating and slows propagation of cracks through the coating.

SUMMARY

According to one embodiment of this disclosure, a coating includes a plurality of elongated reinforcing materials. The coating includes a bond coat in which a first portion of a first elongated reinforcing material is embedded. The coating further includes a ceramic coat proximate to the bond coat in which a second portion of the first elongated reinforcing material is embedded.

According to another embodiment a method for coating a component includes the step of depositing a bond coat on an outer surface of the component. The bond coat extends from an inner surface bonded to the outer surface of the component. The bond coat also includes an outer surface. The inner and outer surface defines a first thickness of the bond coat. The bond coat also includes a plurality of elongated reinforcing materials. The method further includes the step of removing a portion of the bond coat so that a first portion of the first elongated reinforcing material is embedded within the bond coat and a second portion of the elongated reinforcing material protrudes from the outer surface of the bond coat. The method further includes the step of depositing a ceramic coat on the outer surface of the bond coat and the second portion of the elongated reinforcing material so that the second portion of the elongated reinforcing material is embedded within the ceramic coat.

DETAILED DESCRIPTION

Figure 1:
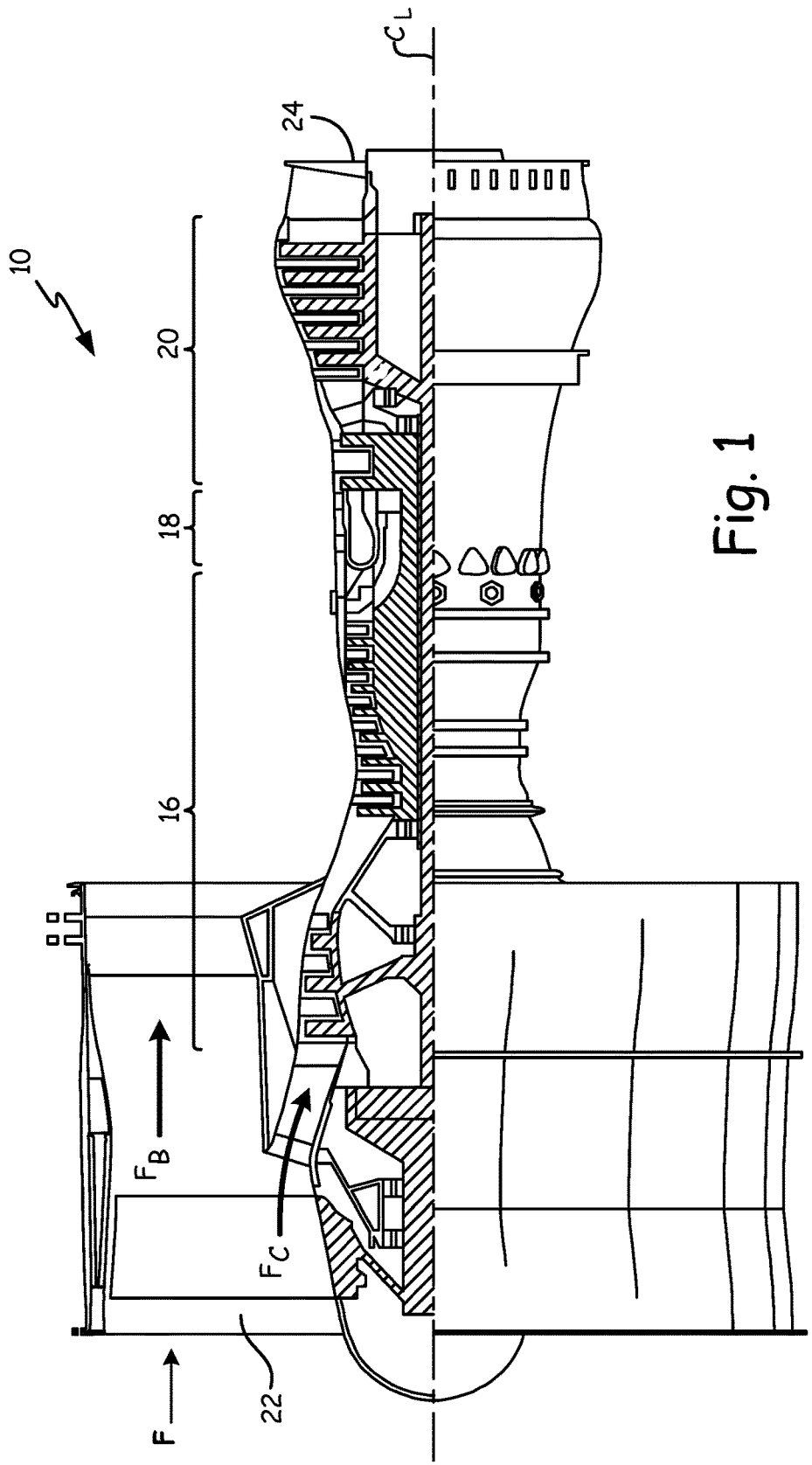
FIG. 1 is a cross sectional view of a gas turbine engine.

In order to better understand the disclosure, a non-limiting embodiment of a coating for a component of a gas turbine engine is described below. FIG. 1 is a cross-sectional view of gas turbine engine 10. Gas turbine engine 10 takes in air flow F and includes fan 12 which drives bypass flow $F_B$ and a turbine core which takes in core flow $F_C$ and having compressor section 16, combustor(s) 18, and turbine 20, which are arranged in flow series along an axial direction with an upstream inlet 22 and downstream exhaust 24. In operation air flow F entering gas turbine engine divides into bypass flow $F_B$ and core flow $F_c$.

Figure 2:
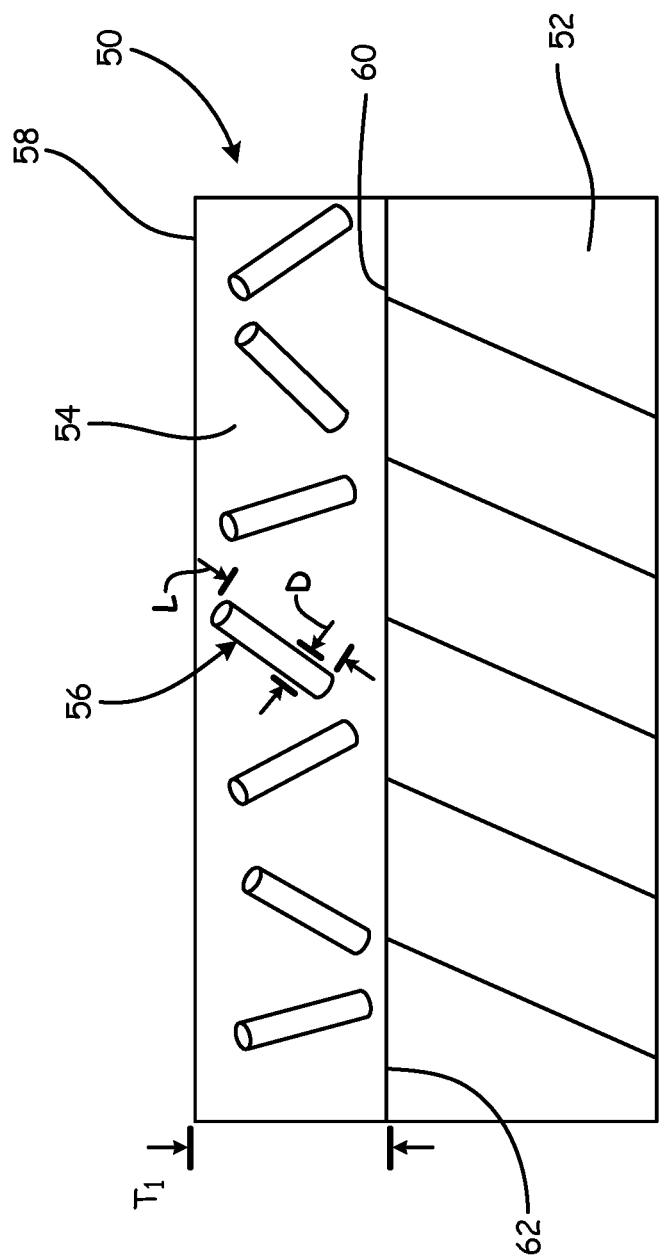
FIG. 2 is a cross sectional view of a component having a bond coat with elongated reinforcing materials disposed therein.
Figure 3:
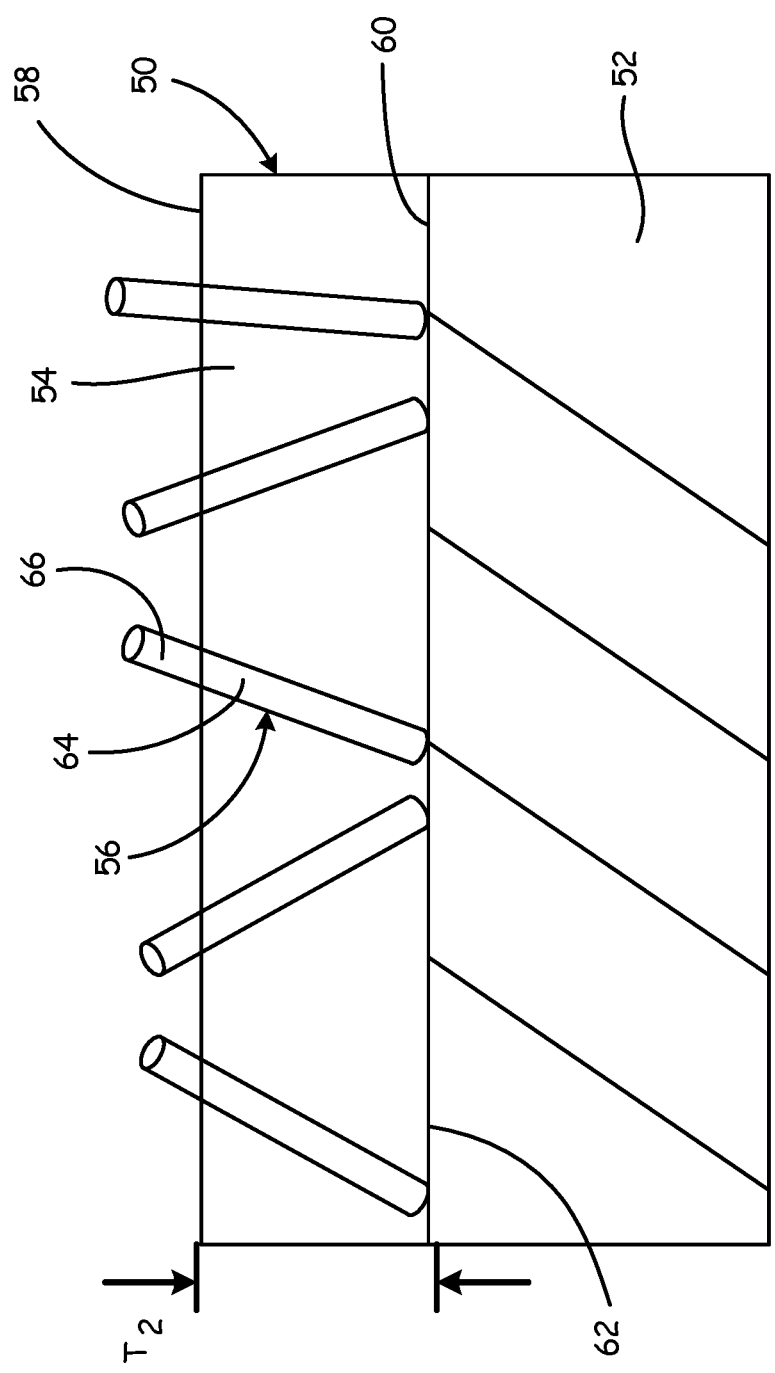
FIG. 3 is a cross sectional view of the component of FIG. 2 with a portion of the bond coat removed and showing a portion of the elongated reinforcing materials protruding from the bond coat.
Figure 4:
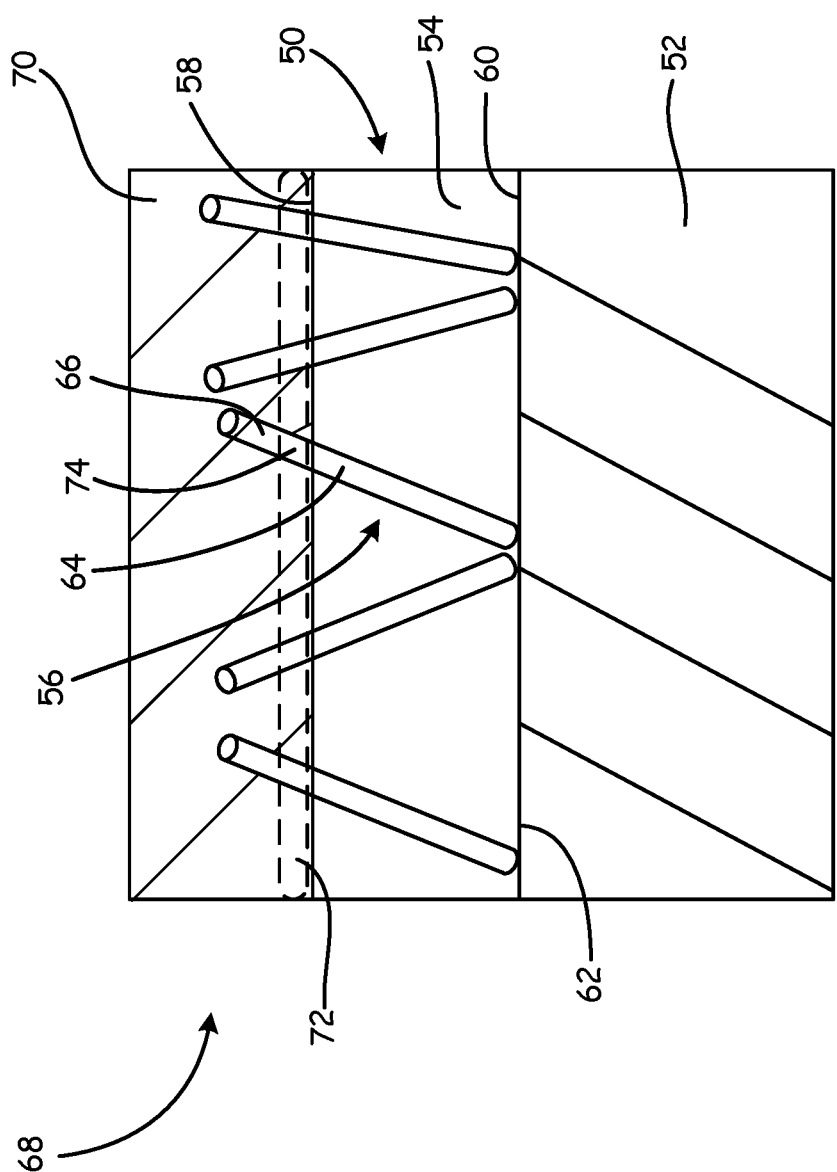
FIG. 4 is a cross sectional view of the component of FIG. 3 where a ceramic coat is disposed on top of the bond coat and the elongated reinforcing materials are disposed within each layer of the coating.

The thermodynamic efficiency of gas turbine engine 10 is strongly tied to the overall pressure ratio, as defined between the compressed air pressure entering combustor(s) 18 and the delivery pressure at upstream inlet 22. In general, higher pressure ratios offer increased greater specific thrust, and may result in higher peak gas path temperatures, particularly downstream of combustor(s) 18 in turbine 20. It is desirable to apply some protective coating to components that are exposed to hot compression gas. FIGS. 2-4 will show an embodiment of a protective coating for a component of gas turbine engine 10.

FIG. 2 is a cross sectional view showing portion of a protective coating deposited to a component. FIG. 2 shows bond coat 50 and component 52. Bond coat 50 includes MCrAlY alloy 54, elongated reinforcing materials 56, outer surface 58, and inner surface 60. Component 52 includes outer surface 62.

Component 52 in this embodiment is any component in the "hot section" of gas turbine engine 10. The "hot section" includes any components in the flowpath of the combustion gas described above. For example, component 52 can be a turbine blade or turbine vane of turbine section 20 of FIG. 1. Component 52 can be formed from a nickel or cobalt based super alloy. If component 52 is exposed directly to the above described combustion gas, the nickel or cobalt super alloy forming component 52 can oxidize. Oxidation can lead to degradation of component 52 and, eventually, failure of gas turbine engine 10.

Bond coat 50 is deposited on outer surface 62 of component 52. Thickness $t_1$ of bond coat 50 is defined by outer surface 58 of bond coat 50 and inner surface 60 of bond coat 50. Thickness $t_1$ of bond coat 50 can range from about 50 microns (about 0.002 inches) to about 130 microns (about 0.005 inches) thick.

Elongated reinforcing materials 56 are disposed within bond coat 50 throughout MCrAlY alloy 54, where M is nickel, cobalt, or combinations thereof; Cr is chromium; Al is aluminum; and Y is yttrium. In other embodiments, intermetallic alloys other than MCrAlY alloy 54 can be used in bond coat 50. One example of another intermetallic alloy that can be used is platinum aluminide.

Elongated reinforcing materials 56 can be selected from many materials including metallics, intermetallics, pure ceramics, and composites thereof. Examples of suitable elongated reinforcing materials 56 include alumina, zirconia, titanium diboride, zirconia diboride, silicon carbide, tungsten, tungsten carbide, boron nitride, silicon nitride, and any combination thereof. Elongated reinforcing material 56 can also be a coated material. For example, if elongated reinforcing material 56 is a ceramic material it can be vapor coated with a metallic coating. A ratio of each elongated reinforcing material 56 defined by a length l of material 56 to a diameter d of material 56 can range from about 3:1 to about 100:1. Elongated reinforcing material 56 can also be physically described as being a fiber, whisker, or a platelet.

Elongated reinforcing materials 56 can help to prevent crack propagation in bond coat 50. During operation of gas turbine engine 10, cracks can develop in bond coat 50. These cracks can propagate and weaken bond coat 50, which can lead to spallation of bond coat 50 from component 52. Spallation is a process in which fragments of material are ejected from a body due to stress. If spallation of bond coat 50 occurs, component 52 can be exposed to hot combustion gasses. This can lead to corrosion and eventually to failure of component 52. Elongated reinforcing materials 56, however, can help to arrest crack propagation. This is because a crack must divert around elongated reinforcing material 56 in order to propagate. If the stress causing the crack does not supply enough energy to divert the crack around elongated reinforcing material 56, then crack propagation can be slowed or even stopped.

The surface texture of elongated reinforcing material 56 can affect the ability of material 56 to arrest crack propagation. Bond coat 50 can include elongated reinforcing materials 56 having a smooth surface or a rough surface. If elongated reinforcing material 56 has a smooth surface, cracks must divert completely around material 56 to propagate. If elongated reinforcing material 56 has a rough surface, (e.g., an undulating surface or a surface with projections) material 56 will have a smaller diameter at some points along the surface of elongated reinforcing material 56 compared to other points. Cracks will require less energy to propagate around the smaller diameter compared to the larger diameter of elongated reinforcing material 56. Therefore elongated reinforcing material 56 having a rough surface, as a whole, will not be as effective at slowing propagation as it would be if it had a smooth surface having a continuous diameter.

If, however, elongated reinforcing material 56 does have a rough surface, then material 56 will have a stronger mechanical engagement within bond coat 50. This can help elongated reinforcing material 56 to bridge a crack in bond coat 50. That is if a crack develops in bond coat 50 around elongated reinforcing material 56, material 56 can span across the crack and hold bond coat 50 together. The rougher the surface of elongated reinforcing material 56 the less likely it is to be pulled out of bond coat 50.

Bond coat 50 can be formed in many different ways. In one non-limiting example, if bond coat 50 is formed from a combination of MCrAlY alloy 54 and elongated reinforcing materials 56 that are alumina whiskers, those components can be mechanically alloyed through a ball milling process to form an agglomerate powder of MCrAlY alloy 54 and alumina whiskers 56. The powder resulting from the ball milling process can include individual grains having a diameter from about 5 microns to about 150 microns. The powder can be deposited on outer surface 62 of component 52 to form bond coat 50. The powder can be deposited on outer surface 62 in many ways. For example, the powder can be deposited using deposition techniques such as low pressure plasma spray, electron beam physical vapor deposition, electron beam directed vapor deposition, high velocity air fuel (HVAF) deposition, or high velocity oxygen fuel (HVOF) deposition.

Another way to form bond coat 50 is to use a slurry or powder blend method. For example, if bond coat 50 is formed from alumina whiskers 56 and MCrAlY alloy 54, a slurry can be formed where whiskers 56 account for a volume percent of about two percent to about twenty percent of the slurry and have a length to diameter ratio of 3:1 to 10:1. MCrAlY alloy 54 particles can have a diameter of about six microns to about twenty-two microns. Polyvinyl alcohol binder can be added and can account for a weight percent of about two percent of the slurry. The slurry powder is mixed and applied directly to outer surface 62 of component 52. The slurry powder and component 52 can be heated in a vacuum for about two hours at about 1079 degrees Celsius (1975 degrees Fahrenheit). Bond coat 50 is formed when the slurry cools. Bond coat 50 can undergo further heat treatment to densify bond coat 50. Depending on the application, a density of between 66 percent and 100 percent is desired. For thermal barrier applications as an example, where good as produced bond strength is required in addition to long time stability of the thermally grown oxide layer on the bond coat, a density of greater than 90 percent is desirable.

Another way to deposit bond coat 50 onto outer surface 62 of component 52 is through electrophoretic deposition. Electrophoretic deposition involves putting materials in a colloidal suspension. In a colloidal suspension, materials are dispersed throughout a gas or a liquid. The suspension is bounded by two electrodes. The materials in the suspension are charged and collect on one of the two electrodes. As an example, where bond coat 50 includes MCrAlY alloy 54 and elongated reinforcing materials 56, component 52 would be charged such that it would be an electrode. MCrAlY alloy 54 and elongated reinforcing materials 56 would be put in a colloidal suspension and would be deposited on component 52.

Electrophoretic deposition is useful when depositing anisotropic materials such as elongated reinforcing materials 56 because the positioning of the materials can be controlled through the deposition process. Anisotropic materials are those that have a different value (e.g. strength) when measured in different directions. Because elongated reinforcing materials 56 are extended lengthwise they are strongest in that direction. Using electrophoretic deposition, elongated reinforcing materials 56 can be positioned to face the same direction. This is largely in contrast to the other deposition techniques described above which generally result in elongated reinforcing materials 56 being positioned generally to face random directions in bond coat 50. That is, a first elongated reinforcing material 56 can face a different direction than a second elongated reinforcing material 56 such as those shown in FIG. 2.

As discussed above, the deposition technique used in forming bond coat 50 largely controls the orientation of elongated reinforcing materials 56. If elongated reinforcing materials 56 are oriented in substantially the same direction, bond coat 50 will be strongest in that direction, due to the anisotropic nature of materials 56. This can be beneficial in some respects if bond coat 50 requires strength in that direction. As an example, it may be beneficial orient substantially all elongated reinforcing materials 56 to be substantially normal to plane formed by bond coat 50. The substantially uniform projection of strength in that direction can help to arrest in-plane crack propagation across bond coat 50.

If elongated reinforcing materials 56 are positioned to face in random directions throughout bond coat 50, then bond coat 50 might not be stronger in any particular direction versus another direction. Bond coat 50 can be stronger as a whole, however, if elongated reinforcing materials 56 face random directions because the random orientation provides strength in many directions.

Elongated reinforcing materials 56 can be dispersed throughout the volume of bond coat 50. For example, elongated reinforcing materials 56 can be spaced between about ten microns to about one hundred microns apart in bond coat 50. Additionally, elongated reinforcing materials 56 can account for almost any percentage of the volume of bond coat 50. For example, elongated reinforcing materials 56 can account for about two percent to about twenty percent of the total volume of bond coat 50.

FIG. 3 is a cross sectional view of bond coat 50 where a portion of bond coat 50 has been removed. FIG. 3 also shows first portion 64 of elongated reinforcing material 56, and second portion 66 of elongated reinforcing material 56. As shown in FIG. 3, a portion of bond coat 50 has been removed. As a result, bond coat 50 has a thickness $t_2$ that is less than thickness $t_1$ of FIG. 2. First portion 64 of elongated reinforcing material 56 is embedded within bond coat 50. Second portion 66 of elongated reinforcing material 56 protrudes beyond outer surface 58 of bond coat 50. Second portion 66 can protrude from outer surface 58 by about one micron to about ten microns. The exact distance that second portion 66 protrudes from outer surface 58 depends on how much of bond coat 50 is removed and the length l of elongated reinforcing material 56.

The removed portion of bond coat 50 can be removed using a subtractive manufacturing process such as a chemical milling process. In a chemical milling process a substrate is exposed to an etchant. An etchant is a reagent that reacts with the substrate and removes it. Some etchants that are commonly used include sodium hydroxide, hydrochloric acid, nitric acid, hydrofluoric acid, and Keller's reagent. Keller's reagent is a mixture of nitric acid, hydrochloric acid, and hydrofluoric acid. A preferred etchant is one that will react with MCrAlY alloy 54 of bond coat 50 but not with elongated reinforcing material 56. In some instances, the etchant will thin elongated reinforcing materials 56 during the etching process. In those cases, the etching conditions such as the concentration of the etchant, reaction time, or use of a masking agent, will have to be controlled to achieve a desirable ratio of dissolution rate of elongated reinforcing material 56 and the removal rate of bond coat 50.

Other etching techniques can be used to remove the portion of bond coat 50. One example of another technique is plasma etching. In plasma etching, ions are generated and accelerated at a surface where a target material is removed. To prevent them from being etched by the ions, elongated reinforcing materials 56 can be formed from a material that is not degraded by the ions. A mask can also be positioned on outer surface 58 of bond coat 50. The mask can have openings positioned over the portion of bond coat 50 to be etched. That way the mask substantially covers elongated reinforcing materials 56 so that they are not etched.

FIG. 4 is a cross sectional view showing coating 68. Coating 68 includes bond coat 50, ceramic coat 70, and oxide layer 72 (shown in phantom). Third portion 74 of elongated reinforcing material 56 is also shown.

Ceramic coat 70 is deposited on outer surface 58 of bond coat 50. Ceramic coat 70 can be deposited on bond coat 50 by any number of thermal spray processes, such as plasma spray, electron beam, electron beam physical vapor deposition, HVOF, HVAF, or cathodic arc. Ceramic coat 70 can be a thermal barrier coating or an environmental barrier coating. In the embodiment shown in FIG. 4, ceramic coat 70 is a thermal barrier coating. Ceramic coat 70 can include various porosities such as those ranging from about five percent to about fifty percent by volume. If ceramic coat 70 is a thermal barrier coating, the ceramic material forming it can be a ceramic composite such as yttria-stabilized zirconia, hafnia, gadolinia, gadolinia zirconate, molybdate, alumina, and combinations thereof. Thermal barrier coatings can include one or more layers of these ceramics. Ceramic coat 70 as shown in FIG. 4, is formed from one layer of ceramic material.

In other embodiments, ceramic coat 70 can be an environmental barrier coating. Environmental barrier coatings are generally characterized as formed from multiple oxide layers. Each layer can be formed of an oxide such as alumina, hafnia, or zirconia.

As shown in FIG. 4, second portion 66 of elongated reinforcing material 56 is embedded in ceramic coat 70. First portion 64 of elongated reinforcing material 56 is embedded in bond coat 50. Accordingly, elongated reinforcing material 56 extends into both ceramic coat 70 and bond coat 50. Ceramic coat 70 and bond coat 50 are, therefore, mechanically interlocked by elongated reinforcing materials 56.

Oxide layer 72 can be what is known as a thermally grown oxide layer. If bond coat 50 includes MCrAlY alloy 54 or any other oxidizing metal, a thermally grown oxide layer can form between ceramic coat 70 and bond coat 50 during operation of gas turbine engine 10. Oxide layer 72 can form because oxygen is able to diffuse through micro cracks or pores in ceramic coat 70. When the oxygen interacts with bond coat 50 an oxide scale such as alumina builds up. If oxide layer 72 forms, third portion 74 of elongated reinforcing material 56 extends through oxide layer 72. Thus bond coat 50, oxide layer 72, and ceramic coat 70 are all mechanically interlocked by elongated reinforcing material 56.

Figure 5:
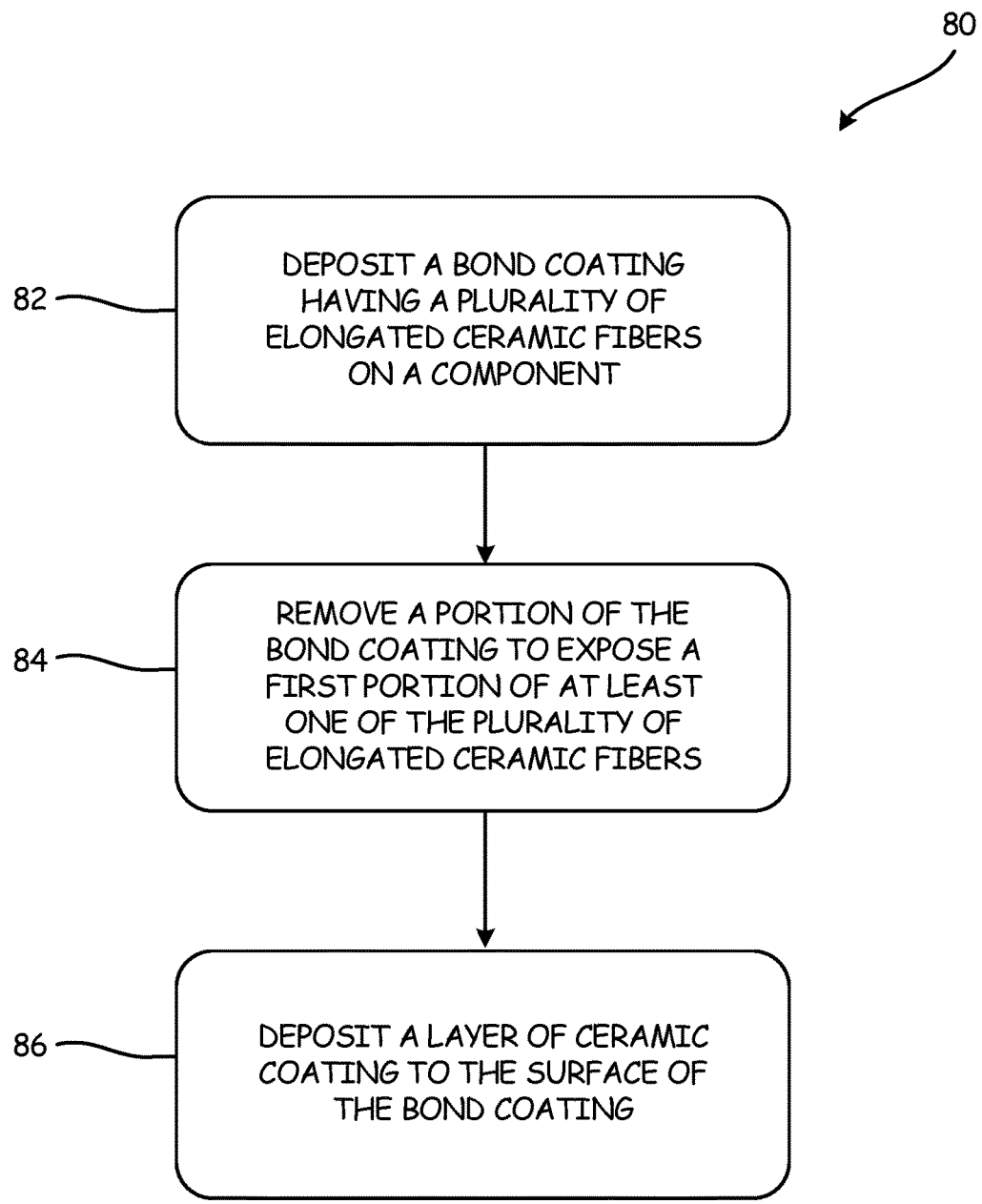
FIG. 5 is a flow diagram illustrating one embodiment of a method for coating a part.

FIG. 5 is a flow diagram illustrating an embodiment of a method for coating a component. As shown in FIG. 5, method 80 includes depositing step 82, which includes depositing bond coat 50 having a plurality of elongated reinforcing materials 56 on component 52. Removal step 84 follows depositing step 82 and includes removing a portion of bond coat 50 in order to expose a portion of elongated reinforcing materials 56. Depositing step 86 follows removal step 84 and includes depositing ceramic coat 70 onto bond coat 50. After these steps have been carried out, component 52 will have protective coating 68 with a plurality of elongated reinforcing materials 56 extending through both bond coat 50 and ceramic coat 70.

There are many benefits in using coating 68 having elongated reinforcing materials 56 including the following non-limiting examples. As discussed above, elongated reinforcing materials 56 mechanically interlock bond coat 50, ceramic coat 70, and oxide layer 72 (if present). Each of these layers of coating 68 can have a different modulus of elasticity and a different coefficient of thermal expansion. As a result, each layer of coating 68 reacts to the thermal cycles during operation of gas turbine engine 10 differently. This can lead to a weakened connection between each layer of coating 68 and eventual separation of each layer. Elongated reinforcing materials 56, however, span across each layer of coating 68 and can help to ensure that they all remain connected to each other.

Beyond improving the connection between the layers of coating 68, elongated reinforcing materials 56 can help to arrest crack propagation in each layer of coating 68 by causing those cracks to diverge around materials 56. That is to say rather than the crack propagation benefits of elongated reinforcing materials 56 being confined to one layer of coating 68, they are present in all layers. Coating 68, therefore, is resistant to crack propagation across the interface of each layer. Additionally, elongated reinforcing materials 56 can bridge cracks in each layer of coating 68 and cracks across the layers of coating 68.

Yet another benefit of coating 68 is that coating 68 can include different types of elongated reinforcing materials 56. For example, coating 68 can include whiskers, fibers, or platelets made from different materials. Coating 68 would, therefore, have a bimodal distribution of elongated reinforcing materials 56. Each elongated reinforcing material 56 can have a different length such that a shorter first material 56 can be disposed within bond coat 50 and oxide layer 72 while a longer second material 56, different than the first material, can also be disposed within bond coat 50, oxide layer 72, and ceramic coat 70. Additionally, if ceramic coat 70 includes multiple ceramic layers, elongated reinforcing materials 56 of increasing length and formed from different materials can be included in bond coat 50 to extend into each layer of ceramic coat 70. Factors such as the modulus of elasticity and coefficient of thermal expansion of elongated reinforcing material 56 and those of the layer of ceramic coat 70 that material 56 interacts with can drive the decision of which types of elongated reinforcing materials 56 are used.

DISCUSSION OF POSSIBLE EMBODIMENTS

The following are non-exclusive descriptions of possible embodiments of the present invention.

A coating for a component according to an exemplary embodiment of this disclosure, among other possible things includes a plurality of elongated reinforcing materials, a bond coat in which a first portion of a first elongated reinforcing material is embedded therein; and a ceramic coat proximate to the bond coat, wherein a second portion of the first elongated reinforcing material is embedded within the ceramic coat.

The coating of the preceding paragraph can optionally include, additionally and/or alternatively, any one or more of the following features, configurations and/or additional components:

A further embodiment of the foregoing coating, and including an oxide layer wherein a third portion of the first elongated reinforcing material is embedded in the oxide layer.

A further embodiment of the foregoing coating, wherein the bond coat can include an MCrAlY alloy, wherein M is selected from the group consisting of: nickel, cobalt, and combinations thereof and Cr is chromium, Al is aluminum, and Y is yttrium.

A further embodiment of the foregoing coating, wherein the first portion of the first elongated reinforcing material and a first portion of a second elongated reinforcing material can face substantially the same direction.

A further embodiment of the foregoing coating, wherein the first portion of the first elongated reinforcing material and a first portion of a second elongated reinforcing material can face substantially different directions.

A further embodiment of the foregoing coating, wherein a length to diameter ratio of each of the plurality of elongated reinforcing materials can range from about 3:1 to about 20:1.

A further embodiment of the foregoing coating, wherein the first elongated reinforcing material and a second elongated reinforcing material can be spaced between about 10 microns to about 100 microns apart in the coating.

A further embodiment of the foregoing coating, wherein the component can be a component of a gas turbine engine.

A further embodiment of the foregoing coating, wherein the oxide layer can be a thermally grown oxide layer.

A further embodiment of the foregoing coating, wherein the elongated reinforcing materials can comprise between about two percent and about twenty percent of the total volume of the coating.

A further embodiment of the foregoing coating, wherein the ceramic coat can be a thermal barrier coating or an environmental barrier coating.

A further embodiment of the foregoing coating, wherein at least one of the elongated reinforcing materials can be a whisker, fiber, or platelet.

A further embodiment of the foregoing coating, wherein the elongated reinforcing materials can be selected from the group consisting of alumina, zirconia, titanium diboride, zirconia diboride, silicon carbide, tungsten, tungsten carbide, boron nitride, silicon nitride, and combinations thereof.

A method of coating a component according to an exemplary embodiment of this disclosure, among other possible things includes depositing a bond coat on an outer surface of the component, wherein the bond coating includes: an inner surface bonded to the outer surface of the component; an outer surface, the inner surface and outer surface defining a first thickness of the bond coat; and includes a plurality of elongated reinforcing materials; removing a portion of the bond coat so that a first portion of a first elongated reinforcing material is embedded within the bond coat and a second portion of the elongated reinforcing material protrudes from the outer surface of the bond coat; and depositing a ceramic coat on the outer surface of the bond coat and the second portion of the elongated reinforcing material, so the second portion of the first elongated reinforcing material is embedded within the ceramic coat.

The method of the preceding paragraph can optionally include, additionally and/or alternatively, any one or more of the following features, configurations and/or additional components:

A further embodiment of the foregoing method, wherein the first portion of the first elongated reinforcing material can protrude from the bond coat between about 1 micron and about 10 microns.

A further embodiment of the foregoing method, wherein the step of removing the portion of the bond coat can be performed using a process selected from the group consisting of: chemical etching or plasma etching, and combinations thereof.

A further embodiment of the foregoing method, wherein the step of depositing a bond coat on the outer surface of the component can be performed using a process selected from the group consisting of: low pressure plasma spray, electron beam physical vapor deposition, electron beam directed vapor deposition, high velocity air fuel deposition, high velocity oxygen fuel deposition, electrophoretic deposition, slurry deposition and combinations thereof.

A further embodiment of the foregoing method, and including the step of forming an oxide layer between the bond coat and the ceramic coat so that a third portion of the first elongated reinforcing material is embedded in the oxide layer.

A further embodiment of the foregoing method, wherein the bond coat is heat treated.

A further embodiment of the foregoing method, wherein the ceramic coat can be deposited on the bond coat using a process selected from the group consisting of: plasma spray, electron beam, high velocity air fuel deposition, high velocity oxygen fuel deposition, electron beam physical vapor deposition, cathodic arc, and combinations thereof While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of coating a component comprising the steps of:
    depositing a bond coat formed from a metal alloy on an outer surface of the component, wherein the bond coat extends from an inner surface bonded to the outer surface of the component to an outer surface, the inner surface and the outer surface of the bond coat defining a first thickness of the bond coat wherein the bond coat comprises a plurality of elongated reinforcing materials disposed throughout the metal alloy;
    removing a layer of the bond coat on a side of the bond coat opposite the component so that a first portion of a first elongated reinforcing material is embedded within the bond coat and a second portion of the elongated reinforcing material protrudes from the outer surface of the bond coat; and
    depositing a ceramic coat on the outer surface of the bond coat and the second portion of the elongated reinforcing material, so that the second portion of the first elongated reinforcing material is embedded within the ceramic coat.

2. The method of claim 1, wherein the first portion of the first elongated reinforcing material protrudes from the outer surface of the bond coat between about 1 micron and about 10 microns.

3. The method of claim 1, wherein the step of removing the layer of the bond coat is performed using a process selected from the group consisting of: chemical etching or plasma etching, and combinations thereof.

4. The method of claim 1, and further comprising:
    forming an oxide layer between the bond coat and the ceramic coat so that a third portion of the first elongated reinforcing material is embedded in the oxide layer.

5. The method of claim 1, and further comprising:
    heat treating the bond coat.

6. The method of claim 1, wherein the ceramic coat is deposited on the bond coat using a process selected from the group consisting of: plasma spray, electron beam, high velocity air fuel deposition, high velocity oxygen fuel deposition, electron beam physical vapor deposition, cathodic arc, and combinations thereof.

7. The method of claim 1, wherein the ceramic coat is a thermal barrier coating or an environmental barrier coating.

8. The method of claim 1, wherein the elongated reinforcing materials comprise a material selected from the group consisting of: alumina, zirconia, titanium diboride, zirconia diboride, silicon carbide, tungsten, tungsten carbide, boron nitride, silicon nitride, and combinations thereof.

9. The method of claim 1, wherein the elongated reinforcing materials comprise between about two percent and about twenty percent of the total volume of the component coating.

10. The method of claim 1, wherein a length to diameter ratio of each of the plurality of elongated reinforcing materials ranges from about 3:1 to 20:1.

11. The method of claim 1 and further comprising:
    forming the bond coat by mechanically alloying a mixture of an MCrAlY alloy powder and the elongated reinforcing materials.

12. The method of claim 11, wherein the step of depositing the bond coat on the outer surface of the component is performed using a process selected from the group consisting of: low pressure plasma spray, electron beam physical vapor deposition, electron beam directed vapor deposition, high velocity air fuel deposition, high velocity oxygen fuel deposition, and combinations thereof.

13. The method of claim 12, wherein the elongated reinforcing materials are randomly oriented within the bond coat.

14. The method of claim 1 and further comprising:
    forming the bond coat by forming a slurry of an MCrAlY alloy powder and the elongated reinforcing materials.

15. The method of claim 14, wherein the step of depositing the bond coat on the outer surface of the component is performed using a slurry deposition process.

16. The method of claim 15, wherein the elongated reinforcing materials are randomly oriented within the bond coat.

17. The method of claim 1 and further comprising:
    forming the bond coat by forming a colloidal suspension of an MCrAlY powder and the elongated reinforcing materials.

18. The method of claim 17, wherein the step of depositing the bond coat on the outer surface of the component is performed using electrophoretic deposition.

19. The method of claim 18, wherein the elongated reinforcing materials are uniformly oriented within the bond coat.

20. A method of coating a component comprising the steps of:
    depositing a bond coat formed from a metal alloy on an outer surface of the component, wherein the bond coat extends from an inner surface bonded to the outer surface of the component to an outer surface, the inner surface and the outer surface of the bond coat defining a first thickness of the bond coat wherein the bond coat comprises a plurality of elongated reinforcing materials disposed throughout the metal alloy;
    removing a layer of the bond coat on a side of the bond coat opposite the component so that a first portion of a first elongated reinforcing material is embedded within the bond coat and a second portion of the elongated reinforcing material protrudes from the outer surface of the bond coat; and
    forming an oxide layer proximate the outer surface of the bond coat so that a third portion of the first elongated reinforcing material is embedded in the oxide layer.

* * * * *